United States Patent [19]

Shirotori et al.

[11] Patent Number: 5,388,104
[45] Date of Patent: Feb. 7, 1995

[54] SEMICONDUCTOR INTEGRATED CIRCUIT CAPABLE OF TESTING MEMORY BLOCKS

[75] Inventors: Tsukasa Shirotori, Yokohama; Kazutaka Nogami, Tokyo, both of Japan

[73] Assignee: Kabushiki Kaisha Toshiba, Kawasaki, Japan

[21] Appl. No.: 813,444

[22] Filed: Dec. 26, 1991

[30] Foreign Application Priority Data

Dec. 27, 1990 [JP] Japan .................................. 2-418754

[51] Int. Cl.$^6$ .............................................. G11C 29/00
[52] U.S. Cl. ................................ 371/21.1; 371/22.3
[58] Field of Search ................. 371/21.1, 22.5, 15.1, 371/22.1, 25.1, 22.6, 20.4, 22.3, 51.1, 10.1, 2.2, 2.1, 40.1, 22.3; 365/201; 324/210; 360/26, 36.1, 38.1, 47, 53

[56] References Cited

U.S. PATENT DOCUMENTS

| | | | |
|---|---|---|---|
| 4,577,314 | 3/1986 | Chu et al. | 370/94 |
| 4,713,748 | 12/1987 | Magar et al. | 364/200 |
| 4,908,248 | 3/1990 | Pathak et al. | 364/200 |
| 5,072,138 | 12/1991 | Slemmer et al. | 371/21.1 |

FOREIGN PATENT DOCUMENTS 0385591 2/1990 European Pat. Off. .

OTHER PUBLICATIONS

L. Basto et al, "Testing the MC68030 Caches," Sep. 1-3, 1987, International Test Conference 1987 Proceedings, pp. 826-833.

W. Finsterbusch, "Speicherschaltkreis mit selbsttestenden Eigenschaften," Nachrichten Technik Elektronik, vol. 36, No. 9, 1986, pp. 333-335.

Primary Examiner—Robert W. Beausoliel, Jr.
Assistant Examiner—Phung Chung
Attorney, Agent, or Firm—Finnegan, Henderson, Farabow, Garrett & Dunner

[57] ABSTRACT

A semiconductor integrated circuit includes a plurality of writable/readable memory blocks with different address spaces and an address decoder for selecting addresses of the memory blocks. The multiple memory blocks are permitted to share a part of addresses of the memory blocks in a test mode. The writing operation of one of the memory blocks that does not have the largest address space is disabled during a period in which address signals for commonly performing an address scan of individual memory blocks exceeds the address width of that memory block. It is therefore possible to permit a plurality of memory blocks with different address spaces mounted on the same chip to be tested with high precision and without additional burden on the generation of test vectors or on a BIST (built-in self test) test circuit.

10 Claims, 9 Drawing Sheets

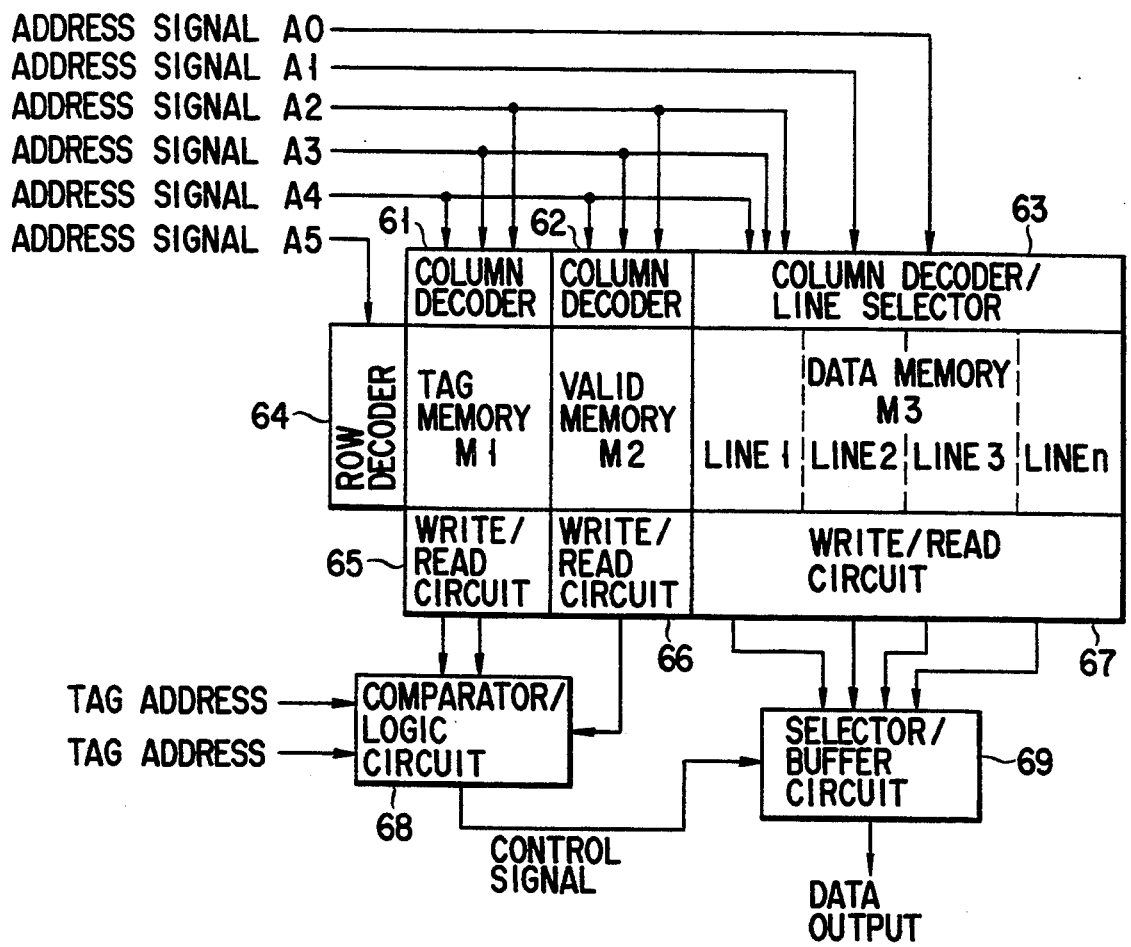
FIG. 1
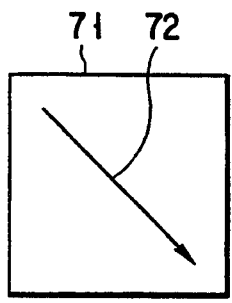
WRITE ALL "0"
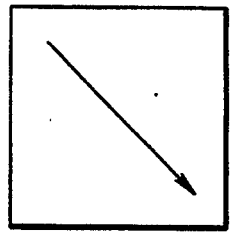
READ "0" AND WRITE "1" IN SAME CELL
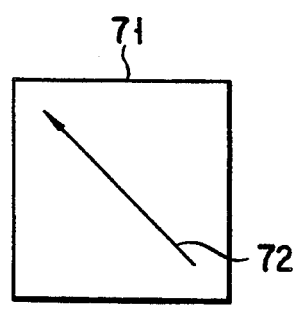
READ "1" IN A DIRECTION FROM A LARGER ADDRESS TO A SMALLER ONE AND WRITE "0" IN SAME CELL
FIG. 2A   FIG. 2B   FIG. 2C

| A3 | A2 | A1 | A0 | |
|----|----|----|----|---|
| 0 | 0 | 0 | 0 | ACCESS TO CELL ① |
| 0 | 0 | 0 | 1 | ACCESS TO CELL ① |
| 0 | 0 | 1 | 0 | ACCESS TO CELL ① |
| 0 | 0 | 1 | 1 | ACCESS TO CELL ① |
| 0 | 1 | 0 | 0 | ACCESS TO CELL ② |
| 0 | 1 | 0 | 1 | ACCESS TO CELL ② |
| 0 | 1 | 1 | 0 | ACCESS TO CELL ② |
| 0 | 1 | 1 | 1 | ACCESS TO CELL ② |

FIG. 3A-II

| A3 | A2 | |
|----|----|---|
| 0 | 0 | ① |
| 0 | 1 | ② |
| 1 | 0 | ③ |
| 1 | 1 | ④ |

MEMORY BLOCKS M1 AND M2 HAVING SMALL SPARE ADDRESS

FIG. 3A-I

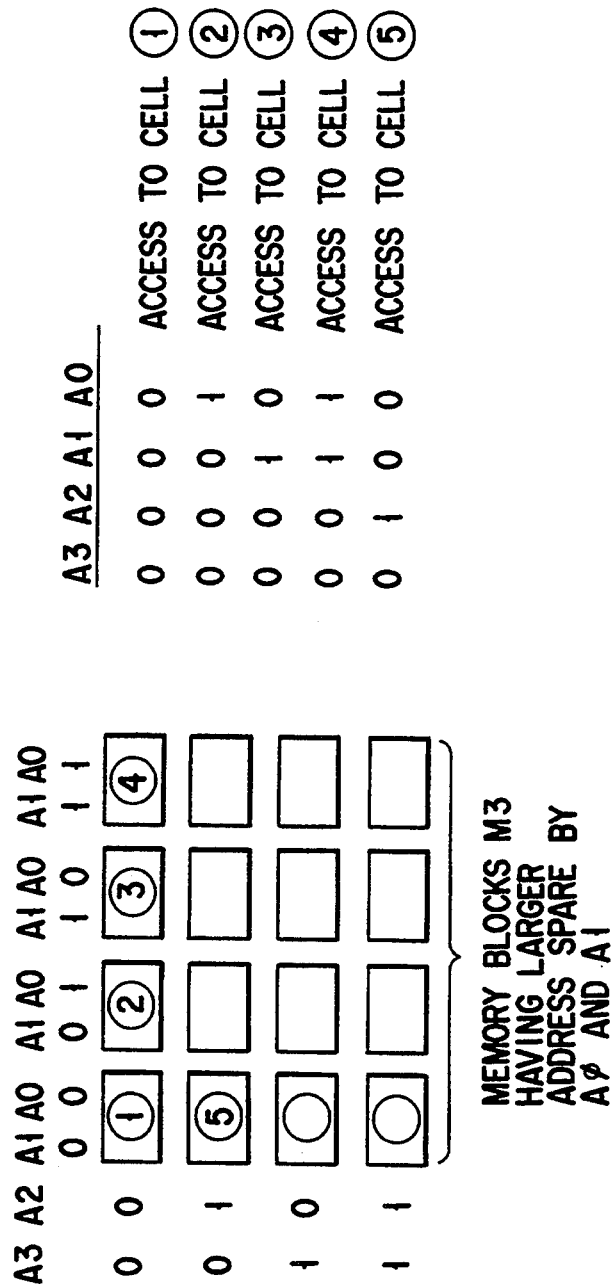

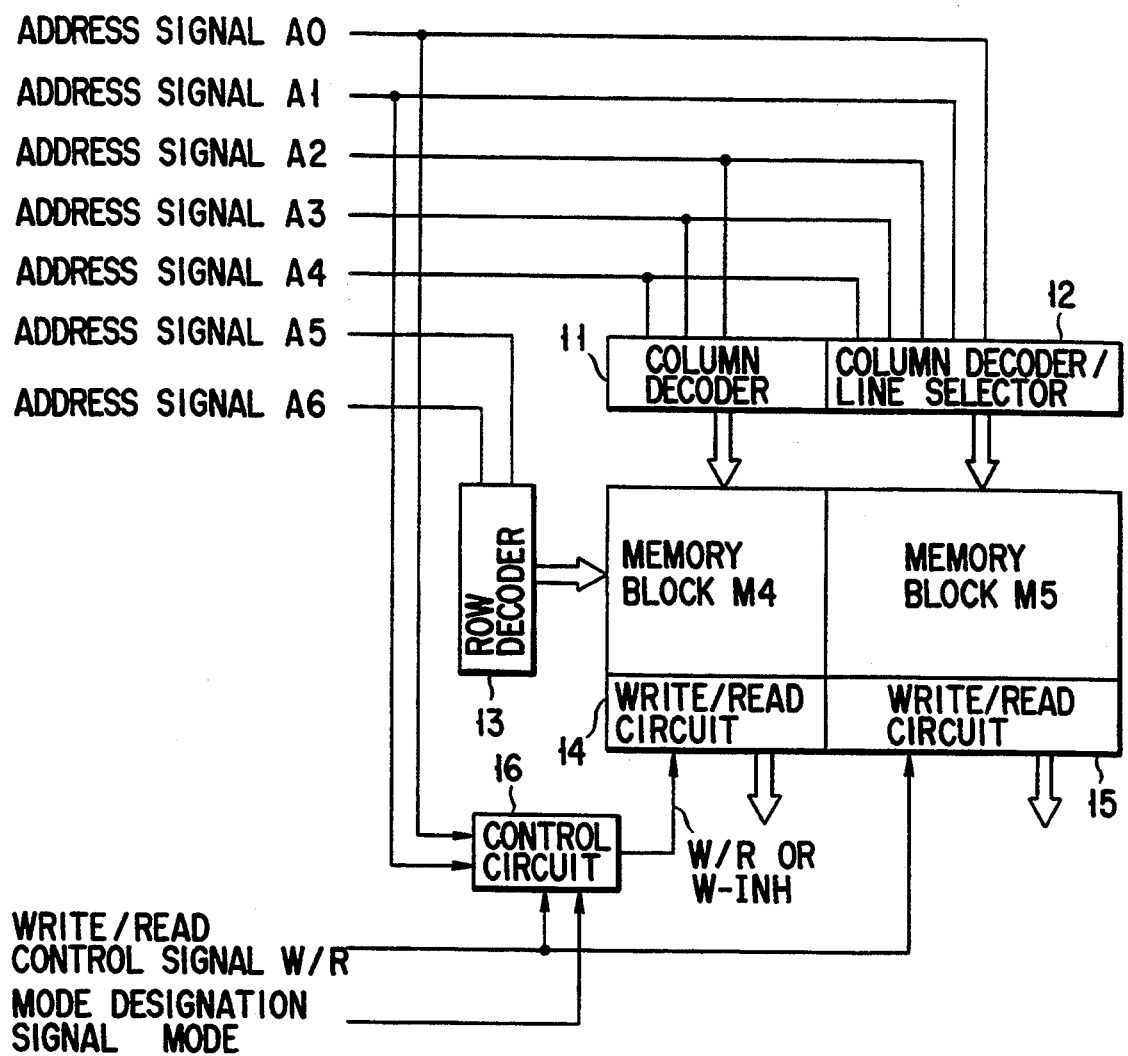
F I G. 4

| A3 | A2 | A1 | A0 | |
|----|----|----|----|---|
| 0  | 0  | 0  | 0  | ACCESS TO CELL ① |
| 0  | 0  | 0  | 1  | DISABLE W/R CONTROL CIRCUIT 16 |
| 0  | 0  | 1  | 0  | DISABLE W/R CONTROL CIRCUIT 16 |
| 0  | 0  | 1  | 1  | DISABLE W/R CONTROL CIRCUIT 16 |
| 0  | 1  | 0  | 0  | ACCESS TO CELL ② |
| 0  | 1  | 0  | 1  | DISABLE W/R CONTROL CIRCUIT 16 |
| 0  | 1  | 1  | 0  | DISABLE W/R CONTROL CIRCUIT 16 |

FIG. 5A-II

| A3 | A2 | |
|----|----|---|
| 0 | 0 | ① |
| 0 | 1 | ② |
| 1 | 0 | ③ |
| 1 | 1 | ④ |

MEMORY BLOCK M4

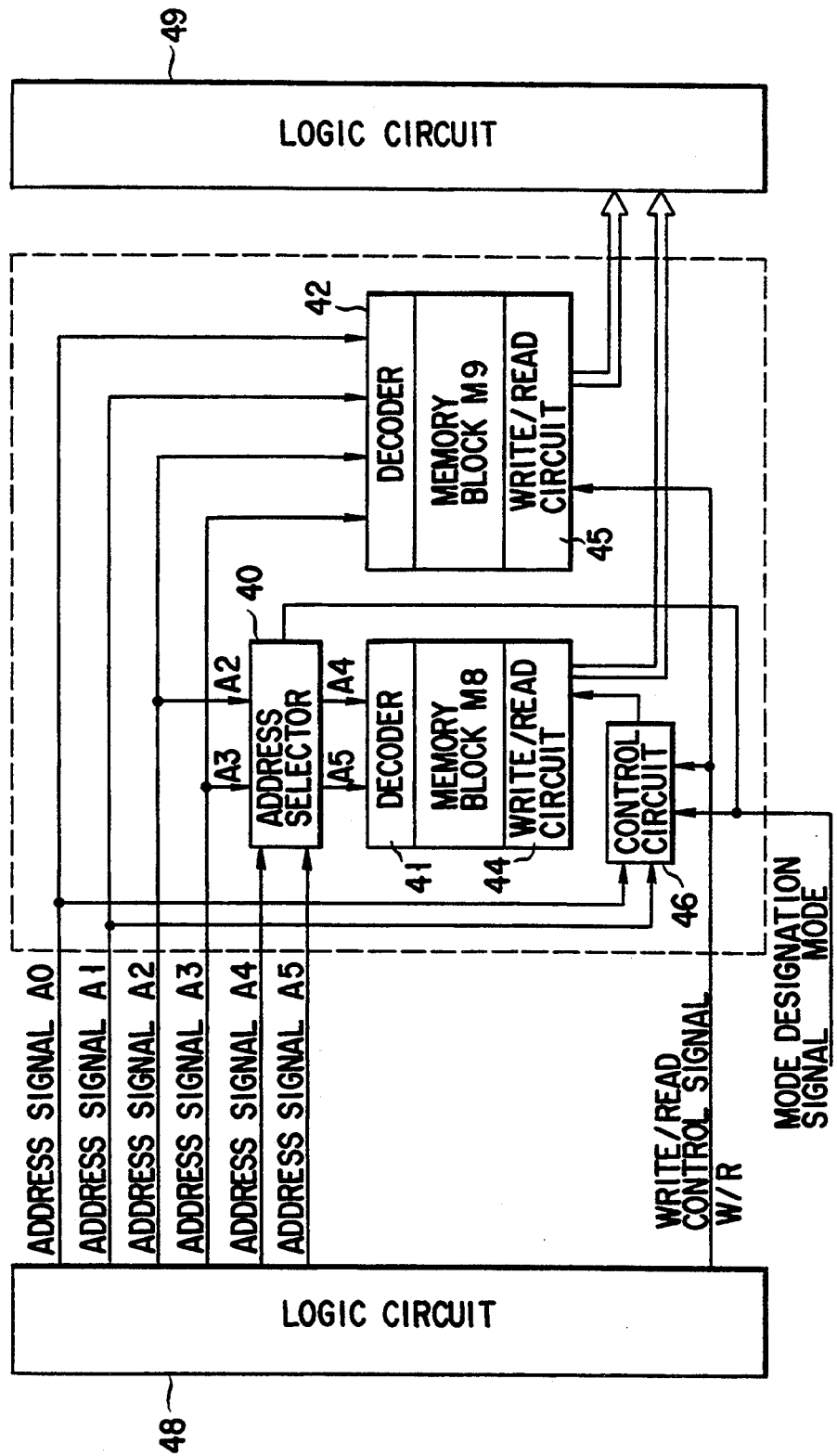
F I G. 7

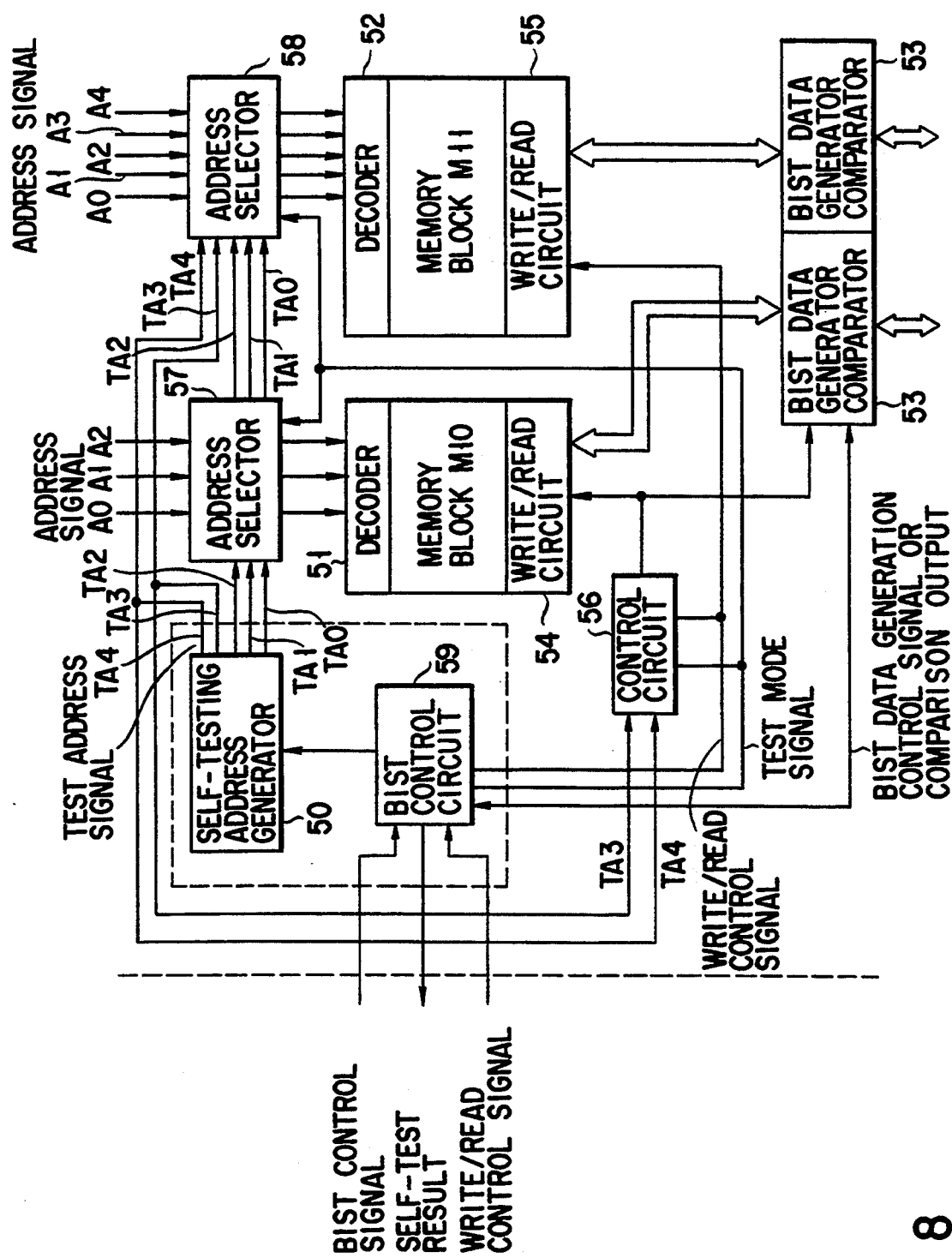
F I G. 8

SEMICONDUCTOR INTEGRATED CIRCUIT CAPABLE OF TESTING MEMORY BLOCKS

BACKGROUND OF THE INVENTION

1. Field of the Invention

The present invention relates to a semiconductor integrated circuit and, more particularly, to a test circuit that facilitates testing of an integrated circuit mixedly including a large capacity memory circuit and a logic circuit, for example.

2. Description of the Related Art

Conventionally, in hybrid integrated circuits having multiple memory blocks mounted on the same chip, a structure (e.g., a cache memory) which shares the addresses of the individual memory blocks or a structure where a test circuit or the like shares the addresses of the individual memory blocks is often used. In this case, as described hereinafter, it is difficult to improve the precision of detecting defects originating from a memory block and to increase the testing efficiency, e.g., shortening the testing time, when a test is conducted to check the functions of a memory circuit.

The methods of testing memory circuits having the above structure are classified into two general categories. One is to use a tester or the like to supply the necessary signals to the memory circuit from outside the integrated circuit, and the other is a BIST (Built-In Self Testing) method which allows the device itself to produce the required test signals to conduct the test. In conducting such tests, the test efficiency will be improved if multiple memories are tested at a time using the shared addresses. However, the address spaces of different memory blocks often should not necessarily be the same.

FIG. 1 is a block diagram exemplifying an arrangement of a cache memory. A tag memory M1, a valid bit memory M2 and a data memory M3 having multiple lines have different address spaces. A column decoder 61 selects column address of the tag memory M1 using address signals A2 to A4. A column decoder 62 selects column address of the valid bit memory M2 using the address signals A2 to A4. A column decoder/line selector 63 selects a column address and a line for the data memory M3 using address signals A0 to A4. A row decoder 64 commonly selects row address of the individual memory blocks M1, M2 and M3 based on an address signal A5. A reference numeral 65 denotes a write/read circuit for the tag memory M1, 66 denotes a write/read circuit for the valid bit memory M2, and 67 denotes a write/read circuit for the data memory M3. A comparator/logic circuit 68 compares an tag address input with tag data which is read from the tag memory M1, checks valid bit data consisting of bits 1 to 4 and read from the valid bit memory M2, and outputs a control signal. A selector/buffer circuit 69 selectively outputs data which are read from multiple lines of the data memory M3, based on the control signal from the comparator/logic circuit 68.

The individual memory blocks M1, M2 and M3 share the address signals A2 to A5 of the address signals A0 to A5. However, the memory blocks M1 and M2 have narrower address space than the memory block M3 by the address signals A1 and A0. Therefore, when a test is conducted on the above cache memory based on the address of the data memory M3 having a large address space, the tag memory M1 and the valid bit memory M2 will access the same address multiple times while the entire addresses of the data memory M3 are circulated once. This will not be significant so much in a simple memory test, but will be significant when a memory test is performed with an improved high precision.

FIGS. 2A through 2C show examples of vectors of an N-system pattern (March) typically used in memory tests. A reference numeral 71 shows the size of a memory block, and 72 indicates the direction where the addresses are advanced. First, a value "0" is written in the entire memory cells from a smaller address to a larger one in FIG. 2A, then the value "0" is read from each memory cell, and then the value "1" is written in the same memory cell in FIG. 2B. In FIG. 2C, the value "1" is read from the memory cells from a larger address to a smaller one and the value "0" is then written in the same memory cell, as indicated by the vector directed opposite to the one in FIG. 2A.

FIGS. 3A and 3B are diagrams explaining the relationship between the address signals of a memory block and cell block selection when the cache memory in FIG. 1 is tested in accordance with the memory test vectors as shown in FIG. 2. FIG. 3A illustrates the relationship between the address signals of the tag memory M1 and valid bit memory M2, which have small address space, and the cell block selection. FIG. 3B illustrates the relationship between the address signals of the data memory M3 having a large address space, and the cell block selection. As shown in FIG. 3A-I, in the memory blocks M1 and M2 having small address spaces, the memory cell ① is accessed when the address signals A2 and A3 are (0, 0). It is apparent from FIG. 3A-II that multiple accesses to the memory cell ① are caused during when the address signals A2 and A3 are scanned sequentially from (0, 0) to (0, 1), (1, 0) and (1, 1) since the address signals A2 and A3 stay (0, 0) during such address scanning. On the other hand, each memory cell in the data memory M3 is accessed by the address signals A0, A1, A2 and A3, as shown in FIG. 3B-I. In accordance with the scanning of the address signals A0, A1, A2 and A3, the individual memory cells ①, ②, ③ and ④ are accessed sequentially, as shown in FIG. 3B-II. In other words, a memory having a small address space will access the same memory cells multiple times while an address not associated with the memory itself, i.e., an address of a memory having a large address space is being accessed. In this situation, since multiple writings will be caused in a single sequence on the same cell of the memory with the small memory space, the read output is likely to differ from the expected value.

with the use of a tester, this situation can be cleared by properly designing the test vectors. However, since test vectors for solid writing are normally used, this measure requires a huge number of vectors in proportion to the address space of a memory to be tested and thus, is not practical. For instance, if the tested memory is an 8K-byte memory, an $N^2$-system pattern for the memory needs 65 M bytes. It is therefore typical to employ a method of automatically generating an address by a tester. However, it is difficult to avoid the multiple accesses with this measure.

According to the BIST method, the memory itself automatically generates address signals and write data and compares the data to test the memory blocks. However, when it is necessary to test a memory with a more complex address pattern due to an increased capacity of memory blocks, the difference between the address spaces of multiple memory blocks would be critical. It would result in an increased testing time and an increased overhead of hardware, i.e., testing circuit.

Since a memory test for conventional semiconductor integrated circuits should be conducted for each of the multiple memory blocks with different address spaces mounted on the same chip, a longer testing time is required, otherwise, a large burden will be put on the test circuit or the generation of test vectors.

SUMMARY OF THE INVENTION

It is therefore an object of the present invention to provide a semiconductor integrated circuit which permits multiple memory blocks with different address spaces mounted on the same chip to be tested at a time with a high precision and without putting any burden on the generation of test vectors or the test circuit for use in a BIST method.

According to an aspect of the present invention, a semiconductor integrated circuit is provided comprising: a plurality of writable/readable memory blocks with different address spaces mounted on a same chip; means for performing address scanning on the writable/readable memory blocks simultaneously in test mode based on one memory block having the largest address space of the memory blocks; and control means for disabling writing in other memory blocks having a smaller address space than the largest address space during an address scan period exceeding address widths of the other memory blocks.

According to another aspect of the present invention, a semiconductor integrated circuit is provided comprising: a writable/readable first memory block having a first address space; at least one writable/readable second memory block, mounted on a same chip as the first memory block and having an address space smaller than the first address space, the second memory block and the first memory block sharing a part of the addresses in a normal operation mode; means for supplying address signals to simultaneously and commonly scan addresses of the first and second memory blocks in a test mode; an address decoder for selecting addresses of the first and second memory blocks based on the address scan signal; and a control circuit for disabling write/read operations on the second memory block in the test mode during a period in which the address signals exceed the address space of the second memory block.

According to still another aspect of the present invention, a semiconductor integrated circuit is provided comprising: a writable/readable first memory block having a first address space; at least one writable/readable second memory block, mounted on a same chip as the first memory block and having an address space smaller than the first address space, the second memory block and the first memory block not sharing any part of the addresses in a normal operation mode; a logic circuit, mounted on the same chip as the first memory block, for supplying address signals to simultaneously and commonly scan addresses of the first and second memory blocks in a test mode; an address selector for selecting part of address signals to perform address scan of the first memory block and generating address signals of the second memory block in the test mode; an address decoder for selecting addresses of the first and second memory blocks based on the address signals from the logic circuit and the address selector; and a control circuit for disabling write/read operations on the second memory block in the test mode during a period in which the address signals of the first memory block exceeds the address space of the second memory block.

According to still another aspect of the present invention, a semiconductor integrated circuit is provided comprising: a writable/readable first memory block having a first address space; at least one writable/readable second memory block, mounted on a same chip as the first memory block and having an address space smaller than the first address space, the second memory block and the first memory block not sharing any part of the addresses in a normal operation mode; a self-testing address generator, mounted on the same chip as the first memory block, for supplying address signals to simultaneously and commonly scan addresses of the first and second memory blocks in a test mode; an address selector for selecting the address signals to generate address signals of each of the memory blocks in a test mode; an address decoder for selecting addresses of the first and second memory blocks based on the address signals from the address selector; and a control circuit for disabling write/read operations on the second memory block in the test mode during a period in which the address signals to commonly perform address scan of the memory blocks exceeds the address space of the second memory block.

In the normal operation mode of the individual memory blocks, the addresses are selected based on address signal inputs associated with each memory block, and write/read operations are then performed. In the test mode of the individual memory blocks, the addresses of the first memory block are scanned by address signals having an address width corresponding to the largest address space among multiple memory blocks, and write/read operations of the memory block are performed. At the same time the addresses of a memory block having a smaller address space are scanned by a part of the address signals, and write/read operations for the memory block are carried out. In this case, writing operations of the memory block having a smaller address space are disabled for a while in which the address width of the address signals exceeds the address width of this memory block, i.e., while an address space irrelevant to this memory block is being designated.

With the above, it is possible to eliminate the unnecessary memory access to a memory block having a small address space, and it is also possible to simultaneously test multiple memory blocks with different address spaces and mounted on the same chip with a high precision, without putting any burden on the generation of test vectors or the test circuit for a BIST method.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a block diagram showing an arrangement of a conventional cache memory;

FIGS. 2A through 2C are diagrams for explaining memory test vectors;

FIGS. 3A-I and 3A-II are diagrams for explaining the relationship between the address signals of a memory block and cell block selection when a memory block having a small address space in FIG. 1 is tested in accordance with the memory test vectors as shown in FIGS. 2A to 2C;

FIGS. 3B-I and 3B-II are diagrams for explaining the relationship between the address signals of a memory block and cell block selection when a memory block having a large address space in FIG. 1 is likewise tested;

FIG. 4 is a block diagram illustrating an arrangement of the first embodiment of a semiconductor integrated circuit according to the present invention;

FIGS. 5B-I and 5B-II are diagrams for explaining the relationship between the address signals of a memory block and cell block selection when a memory block having a large address space in FIG. 4 is likewise tested;

FIG. 7 is a block diagram illustrating an arrangement of the third embodiment of a semiconductor integrated circuit according to the present invention; and FIG. 8 is a block diagram illustrating an arrangement of the fourth embodiment of a semiconductor integrated circuit according to the present invention.

DETAILED DESCRIPTION OF THE PREFERRED EMBODIMENTS

Figure 5:
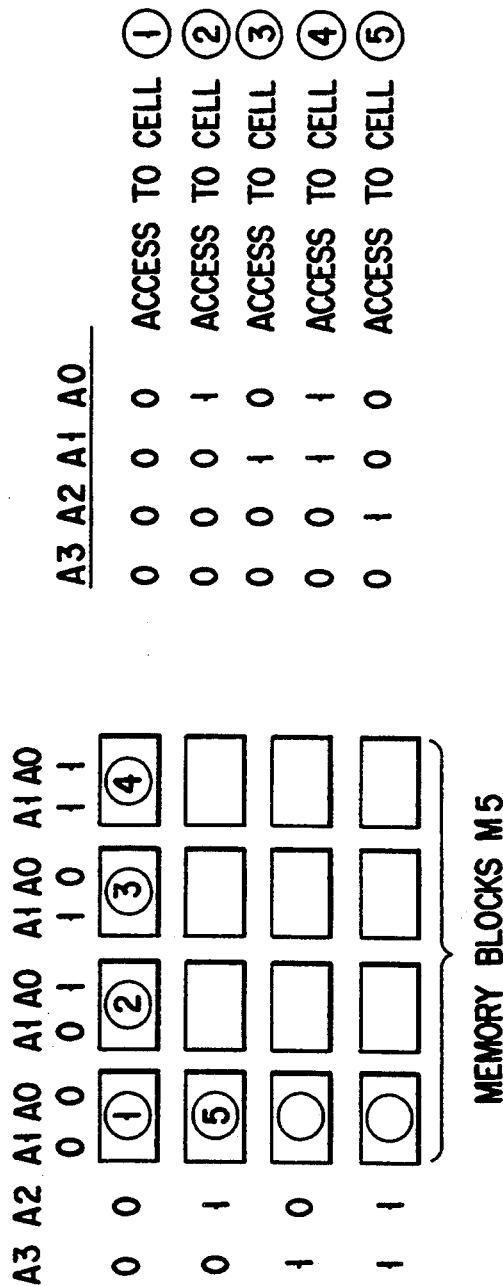
FIGS. 5A-I and 5A-II are diagrams for explaining the relationship between the address signals of a memory block and cell black selection when a memory block having a small address space in FIG. 4 is tested.

Semiconductor integrated circuits according to preferred embodiments of the present invention will now be described referring to the accompanying drawings.

FIG. 4 is a block diagram illustrating an arrangement of the first embodiment of a semiconductor integrated circuit according to the present invention. FIG. 4 shows a hybrid integrated circuit in which multiple (two in this embodiment) writable/readable memory blocks M4 and M5 with different address spaces and a logic circuit (not shown), such as a CPU (Central Processing Unit), are mounted on the same chip. Two memory blocks M4 and M5 are respectively a tag/valid bit memory M4 and a data memory M5 in a cache memory, for example. To select the addresses of the memory blocks M4 and M5, a column decoder 11, a column decoder/line selector 12 and a row decoder 13 are provided. The column decoder 11 selects the column addresses of the memory block M4 using address signals A2 to A4. The column decoder/line selector 12 selects the column addresses of the memory block M5 using address signals A0 to A4. The row decoder 13 commonly selects row addresses for both memory blocks M4 and M5 using address signals A5 and A6. More particularly, the two memory blocks M4 and M5 share the address signals A2 to A6 of the address signals A0 to A6, and the memory block M4 has a smaller address space than the memory block M5 by the address signals A1 and A0. Further, a write/read circuit 14 for performing write/read operations on the memory block M4 and a write/read circuit 15 for performing write/read operations on the memory block M5 are provided.

A write/read control signal W/R is directly input to the write/read circuit 15. A write/read control signal W/R from a control circuit 16 is input to the write/read circuit 14. The control circuit 16 receives the address signals A1 and A0 (part of the address signals A0 to A6), the write/read control signal W/R and a mode designation signal MODE. The control circuit 16 is constituted of a logic circuit. The control circuit 16 outputs the received write/read control signal in the normal operation mode. In the test mode, however it decodes the address signals A1 and A0 and outputs the received read/write control signal as it is or a write disable control signal W-INH in accordance with the results of decoding an inverted signal of the write control signal, for example, the read control signal in this embodiment. More specifically, in the test mode, the control circuit 16 outputs the write/read control signal W/R only when the combination of the address signals A1 and A0, part of the address signals A0 to A6, matches a predetermined pattern, e.g., only when both the address signals A1 and A0 are "0," though such is arbitrarily determined in accordance with the memory structure. However, when the combination of the address signals A1 and A0 is other than the predetermined pattern, e.g., when either one of the address signals A1 and A0 is "1" in the test mode, the circuit 16 does not output the received write/read control signal W/R as it is, but outputs the write disable control signal W-INH. This corresponds to the case where the address signals have an address width exceeding the address width of the memory block M4 or they designate address space not associated with the memory block M4.

The operation of the integrated circuit in FIG. 4 in the test mode will now be discussed referring to FIGS. 5A and 5B. First, in normal operation mode of each memory block, addresses are selected on the basis of the address signals A0 to A3 corresponding to each memory block M4 or M5, and the associated write/read operations are performed. Then, in the test mode of each memory block, cell blocks of each memory block M4 or M5 are selected, as shown in FIGS. 5A and 5B. More specifically, when the address signals A0 to A6 having an address width corresponding to that of the memory block M5, which has the largest address space, are input, the addresses of the memory block M5 are scanned as shown in FIG. 5B-I. Memory cells ①, ②, ③, ④, ⑤, . . . are sequentially accessed for their write/read operations, as shown in FIG. 5B-II. At the same time, the addresses of the memory block M4 are scanned by the address signals A2 to A6 of the address signals A0 to A6 as shown in FIG. 5A-I, followed by write/read operations as shown in FIG. 5A-II. During a period in which the length of the address signals A0 to A6 exceeds the address width of the memory block M4 (in which address space not associated with the memory block M4 is being specified), i.e., when at least one of the address signals A1 and A0 is "1," write operations on the memory block M4 are automatically disabled by the write/read disable control signal W/R-INH, thus preventing multiple accessing. In the test mode, data read from the memory blocks M4 and M5 are outputted to, for example, the outside of the integrated circuit.

Therefore, when a memory test is to be conducted, only the address space of the memory block M5 needs to be considered. This makes it possible to eliminate unnecessary memory accessing and to simultaneously test multiple memory blocks without additional burden on the generation of test vectors.

As a modification of the first embodiment, the control circuit 16 in FIG. 4 may be omitted. The write/read control signals are inputted to the write/read circuit 14 of the memory block M4 in the normal operation mode, while the write/read disable signals are inputted externally in the test mode.

The present invention may also be applied in the case where more complicated memory accessing is needed than in the first embodiment.

Figure 6:
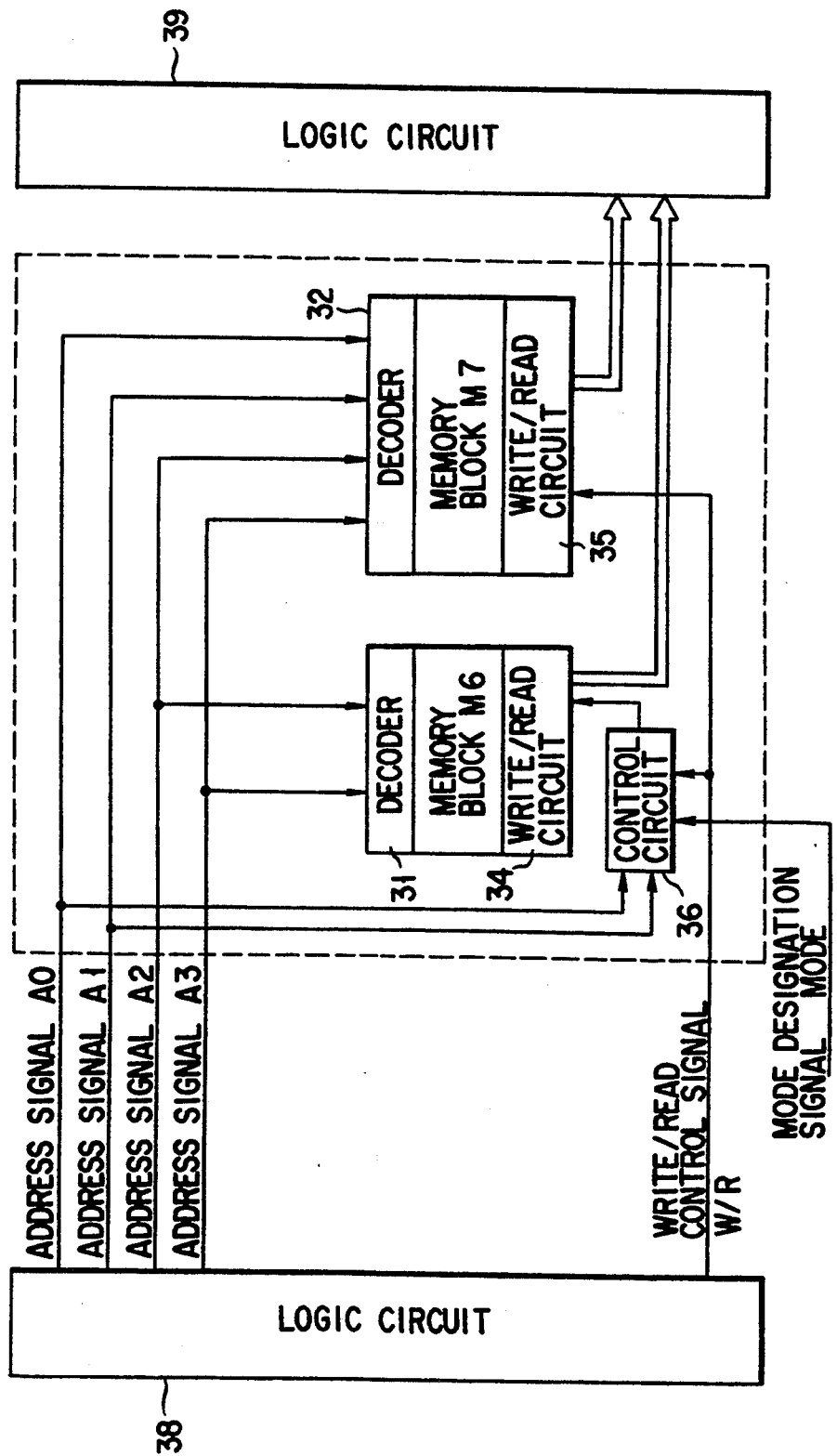
FIG. 6 is a block diagram illustrating an arrangement of the second embodiment of a semiconductor integrated circuit according to the present invention.

FIG. 6 is a block diagram illustrating an arrangement of the second embodiment of a semiconductor integrated circuit according to the present invention. FIG. 6 shows a hybrid integrated circuit in which multiple (two in this embodiment) writable/readable memory blocks M6 and M7 with different address spaces and blocks other than the memory blocks, e.g., logic circuits 38 and 39, are mounted on the same chip. In the second embodiment, the present invention is applied to an integrated circuit which disables signals of the memory blocks in the normal operation mode, and can directly access the memory blocks only in the test mode. A memory block M6 has a smaller address space, and an address decoder 31 selects the addresses of the memory block M6. A memory block M7 has a larger address space, and an address decoder 32 selects the addresses of the memory block M7. A write/read circuit 34 controls write/read operations of the memory cells in the memory block M6. A write/read circuit 35 controls write/read operations of the memory cells in the memory block M7. A control circuit 36 receives a write/read control signal W/R, a mode designation signal MODE and address signals A0 and A1. According to the second embodiment, a logic circuit 38 outputs the address signals A0 to A3 and the write/read control signal W/R. The mode designation signal MODE is supplied externally. Data output from the memory blocks M6 and M7 are supplied to a logic circuit 39. The control circuit 36 operates in the same manner as the control circuit 14 shown in FIG. 4.

In addition to the above-described effect of the first embodiment, the second embodiment can accomplish parallel tests of multiple memory blocks at a time without additional burden on test vectors. This is true even when further miniaturization of an integrated circuit is pursued as the capacity of the memories mixedly mounted on the integrated circuit significantly increases. Thus the integrated circuit memories need to be subjected to the same test as that for a general-purpose memory. This feature is very effective because it improves the testing efficiency, such as shortening the testing time.

FIG. 7 is a block diagram illustrating an arrangement of the third embodiment of a semiconductor integrated circuit according to the present invention. FIG. 7 shows the present invention as applied to a hybrid integrated circuit in which multiple (two in this embodiment) writable/readable memory blocks M8 and M9 with different address spaces and blocks other than the memory blocks, e.g., logic circuits 48 and 49, are mounted on the same chip, and in which multiple memory blocks do not share the same address in the normal operation mode, i.e., their addresses are selected by different address signals. An address selector 40 is controlled in accordance with the mode designation signal MODE. The address selector 40 selects address signals A4 and A5 of the memory block M8 with a smaller address space in the normal operation mode. In the test mode, the address selector 40 selects address signals A2 and A3 among the addresses signals A0 to A5 with an address width corresponding to the memory block M9 having a larger address space. The selector 40 then converts the signals A2 and A3 into signals A4 and A5, which are, in turn, sent to an address decoder 41 of the memory block M8. The address signals A0 to A5 and the write/read control signal W/R are supplied from a logic circuit 48. The mode designation signal MODE is supplied externally. The operation of the control circuit 46 is essentially the same as that of the control circuit 36.

The third embodiment produces the same effect as the second embodiment by the memory blocks sharing a part of the addresses temporarily, e.g., only in the test mode.

FIG. 8 is a block diagram illustrating an arrangement of the fourth embodiment of a semiconductor integrated circuit according to the present invention. FIG. 8 shows the present invention as applied to a hybrid integrated circuit in which multiple (two in this embodiment) writable/readable memory blocks M10 and M11 with different address spaces and blocks other than the memory blocks, e.g., logic circuits (not shown), are mounted on the same chip, and in which multiple memory blocks do not share the same address in the normal operation mode. In the fourth embodiment, a BIST method is employed to facilitate the memory test. A BIST control circuit 59 receives a BIST control signal and write/read control signal W/R, and outputs an address generation control signal to a self-testing address generator 50. The address generator 50 generates test address signals TA0 to TA4 in the test mode. An address selector 57 externally receives the address signals A0 to A2 and sends them to a decoder 51 in the normal operation mode. However, in the test mode the selector 57 selects the test address signals TA0 to TA2 of the test address signals TA0 to TA4 from the self-testing address generator 50 and sends them to the address decoder 31. An address selector 58 externally receives the address signals A0 to A4 and sends them to a decoder 52 in the normal operation mode, while it selects the test address signals TA0 to TA4 from the self-testing address generator 50 and sends them to the address decoder 32 in the test mode. The BIST control circuit 59 outputs a test mode signal to the address selectors 57 and 58 and control circuit 56, and further outputs a write/read control signal W/R to the control circuit 56 and a write/read circuit 55 of the memory block M11. A BIST data generator/comparator 53 generates self-test data and sends the data to a write/read circuit 54 and the write/read circuit 55. The comparator 53 then compares read outputs from the circuits 54 and 55 with an expected value previously prepared. The BIST control circuit 59 further exchanges the BIST data generation control signal and comparison outputs by the BIST data generator/comparator 53, and outputs the result of self-testing. The control circuit 56 receives the test address signals TA3 and TA4 from the self-testing address generator 50 in addition to the write/read control signal W/R and test mode signal TEST. In the test mode, the circuit 56 sends an output to disable write/read operations on the memory block M10 with respect to the address signals TA3 and TA4 to the BIST data generator/comparator 53.

According to the fourth embodiment, the BIST method is employed to facilitate testing of memory blocks, and multiple memory blocks share part of the address in the test mode. In the case where a memory test should be conducted with a more complicated address pattern due to an increased capacity of each memory block, it is possible to suppress the BIST-originated hardware restriction and overhead. Thus, parallel testing of multiple memory blocks is ensured without burdening a testing circuit or the like and the testing efficiency such as shortening of the testing time is improved. The fourth embodiment is therefore very effective.

As described above, the semiconductor integrated circuit embodying the present invention allows multiple memory blocks with different address spaces mounted on the same chip to be tested at a time as well as ensuring a memory test involving complicated address accessing with high precision and without additional burden on the generation of test vectors or a testing circuit for a BIST method. This feature can significantly improve the testing efficiency, such as shortening of the testing time, as compared with the conventional device where a memory test is conducted with high precision only for each of the memory blocks at a time at the price of increased testing time, and is thus very effective.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor integrated circuit comprising:
a plurality of writable/readable memory blocks having different address spaces mounted on a same chip;
means for performing address scanning on said writable/readable memory blocks simultaneously in a test mode based on at least one of the memory blocks having the largest address space from said memory blocks; and
control means, coupled to the writable/readable the memory blocks, for disabling write operations in other memory blocks having a smaller address space than said at least one memory block having the largest address space during a period of the address scanning that exceeds address widths of said other memory blocks.

2. A semiconductor integrated circuit comprising:
a writable/readable first memory block having a first address space mounted on a chip;
at least one writable/readable second memory block, mounted on the same chip as said first memory block and having an address space smaller than said first address space, said second memory block and said first memory block sharing address portions in a normal operation mode;
means for supplying address scan signals to simultaneously and commonly scan addresses of said first and second memory blocks in a test mode;
an address decoder, coupled to the first and second memory blocks, for selecting the addresses of said first and second memory blocks based on said address scan signals; and
a control circuit, coupled to the second memory block, for disabling write operations on said second memory block in said test mode at times when said address scan signals exceed said address space of said second memory block.

3. A semiconductor integrated circuit according to claim 2, wherein said control circuit senses a part of said address scan signals to determine the times when said address scan signals exceeds said address space of said second memory block to disable the write operations on the second memory block.

4. A semiconductor integrated circuit according to claim 2, further comprising a logic circuit, mounted on the same chip, for supplying said address scan signals.

5. A semiconductor integrated circuit according to claim 2, wherein said first and second memory blocks are a cache memory.

6. A semiconductor integrated circuit comprising:
a writable/readable first memory block having a first address space mounted on a chip;
at least one writable/readable second memory block, mounted on the same chip as said first memory block and having an address space smaller than said first address space, said second memory block and said first memory block not sharing same addresses in a normal operation mode;
a logic circuit, mounted on the same chip as said first memory block, for supplying address signals to simultaneously and commonly scan addresses of said first and second memory blocks in a test mode;
an address selector, coupled to the logic circuit, for selecting a part of the address signals to perform the address scan of said first memory block and generating the address signals of said second memory block in the test mode;
an address decoder, coupled to the address selectors, for selecting the addresses of said first and second memory blocks based on said address signals from said logic circuit and said address selector; and
a control circuit, coupled to the logic circuit, for disabling write operations on said second memory block in said test mode at times when said address signals of said first memory block exceeds said address space of said second memory block.

7. A semiconductor integrated circuit according to claim 6, wherein said control circuit senses a part of said address signals to determine the times when said address signals exceeds said address space of said second memory block to disable the write operations on the second memory block.

8. A semiconductor integrated circuit comprising:
a writable/readable first memory block having a first address space mounted on a chip;
at least one writable/readable second memory block, mounted on the same chip as said first memory block and having an address space smaller than said first address space, said second memory block and said first memory block not sharing same addresses in a normal operation mode;
a self-testing address generator, mounted on the same chip as said first memory block, for supplying address signals to simultaneously and commonly scan addresses of said first and second memory blocks in a test mode;
an address selector, coupled to the self-testing address generator, for selecting said address signals to generate address signals of each of said memory blocks in the test mode;
an address decoder, coupled to the address selectors, for selecting the addresses of said first and second memory blocks based on said address signals from said address selector; and a control circuit, coupled to the second memory block, for disabling write operations on said second memory block in said test mode at times when said address signals, for commonly performing address scan of said memory blocks, exceeds said address space of said second memory block.

9. A semiconductor integrated circuit according to claim 8, wherein said control circuit senses a part of said address signals to determine the times when said address signals exceed said address space of said second memory block to disable the write operations on the second memory block.

10. A semiconductor integrated circuit comprising:
at least two memory blocks having different address spaces mounted on a same chip;
means for performing address scanning on said at least two memory blocks, including a first memory block and a second memory block, simultaneously in a test mode corresponding to the first memory block, the first memory block having a larger address space than the second memory block; and
control means, coupled to the second memory block, for disabling the second memory block during an address scan period exceeding the address space of the second memory block.

* * * * *

UNITED STATES PATENT AND TRADEMARK OFFICE
CERTIFICATE OF CORRECTION

PATENT NO. : 5,388,104
DATED : February 07, 1995
INVENTOR(S) : Tsukasa SHIROTORI et al It is certified that error appears in the above-indentified patent and that said Letters Patent is hereby corrected as shown below:

Item [57]
Abstract, cover Page, Line 10 change "exceeds" to --exceed--.

Claim 1, Column 9, Line 41 delete "the" (Second Occurrence).

Claim 3, Column 10, Line 4 change "exceeds" to --exceed--.

Claim 6, Column 10, Line 19 delete "-".

Claim 6, Column 10, Line 32 change "selectors" to --selector--.

Claim 6, Column 10, Line 39 change "exceeds" to --exceed--.

UNITED STATES PATENT AND TRADEMARK OFFICE
CERTIFICATE OF CORRECTION

PATENT NO. : 5,388,104
DATED : February 07, 1995
INVENTOR(S) : Tsukasa SHIROTORI et al It is certified that error appears in the above-indentified patent and that said Letters Patent is hereby corrected as shown below:

Claim 7, Column 10, Line 44 change "exceeds" to --exceed--.

Claim 8, Column 10, Line 65 change "selectors" to --selector--.

Claim 8, Column 11, Line 5 change "exceeds" to --exceed--.

Signed and Sealed this

Fourth Day of July, 1995

Attest:

BRUCE LEHMAN

*Attesting Officer*  *Commissioner of Patents and Trademarks*